(12) United States Patent
Krishnamurthy et al.

(10) Patent No.: US 6,204,696 B1
(45) Date of Patent: Mar. 20, 2001

(54) DOMINO CIRCUITS WITH HIGH PERFORMANCE AND HIGH NOISE IMMUNITY

(75) Inventors: Ram K. Krishnamurthy; Krishnamurthy Soumyanath, both of Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/158,410

(22) Filed: Sep. 22, 1998

(51) Int. Cl.[7] .................................. H03K 19/096

(52) U.S. Cl. ..................... 326/98; 326/95; 326/83; 327/206

(58) Field of Search .................. 326/98, 95, 83, 326/112, 27, 28; 327/206, 205, 534

(56) References Cited

U.S. PATENT DOCUMENTS

| | | | |
|---|---|---|---|
| 4,616,148 | * 10/1986 | Ochii et al. | 327/55 |
| 4,885,479 | * 12/1989 | Oritani | 326/25 |
| 5,034,623 | * 7/1991 | McAdams | 326/62 |
| 5,086,427 | 2/1992 | Witaker et al. . | |
| 5,461,338 | 10/1995 | Hirayama et al. . | |
| 5,483,181 | 1/1996 | D'Souza . | |
| 5,559,461 | 9/1996 | Yamashina et al. . | |
| 5,568,062 | * 10/1996 | Kaplinsky | 326/27 |
| 5,594,361 | * 1/1997 | Campbell | 326/24 |
| 5,644,255 | 7/1997 | Taylor . | |
| 5,814,899 | * 9/1998 | Okumura et al. | 327/534 |
| 5,852,373 | * 12/1998 | Chu et al. | 326/98 |
| 5,892,372 | * 4/1999 | Ciracula et al. | 326/96 |
| 5,986,473 | 11/1999 | Krishnamurthy et al. . | |
| 5,994,918 | 11/1999 | Mehra . | |
| 6,002,292 | * 12/1999 | Allen et al. | 327/379 |

OTHER PUBLICATIONS

P. Larsson et al., "Noise in Digital Dynamics CMOS Circuits," IEEE Journal of Solid–State Circuits, vol. 29, No. 6, Jun. 1994, p. 655–62.

K. Shepard et al., "Noise in Deep Submicron Digital Design," ICCD '96, pp. 524,31, 1996.

T. Sakurai et al., "Low–Power CMOS Design through Vth Control and Low–Swing Circuits" Proceedings of Int'l Symp. On Low Power Electronics and Design, Aug. 18, 1997, pp. 1–6.

Nakagome, Yoshinobu, et al., "Sub–1–V Swing Internal Bus Architecture for Future Low–Power ULSI's," IEEE Journal of Solid–State Circuits, vol. 28, No. 4, Apr. 1993, pp. 414–419.

(List continued on next page.)

Primary Examiner—Michael Tokar
Assistant Examiner—Daniel D. Chang
(74) Attorney, Agent, or Firm—Alan K. Aldous

(57) ABSTRACT

In some embodiments, the invention includes a domino circuit having a precharge circuit including a source follower nFET device coupled to a domino stage conductor. An evaluation path circuit is also coupled to the domino stage conductor. A hysteretic output stage receives a signal from the domino stage conductor and provide therefrom an evaluated output signal. In other embodiments, the invention includes a domino circuit having a predischarge circuit coupled to a domino stage conductor. An evaluation path circuit includes source follower nFET devices coupled to the domino stage conductor. A hysteretic output stage receives a signal from the domino stage conductor and provides therefrom an evaluated output signal. In still other embodiments, the invention includes a domino circuit having a precharge circuit including coupled to a domino stage conductor. An evaluation path circuit is coupled to the domino stage conductor. An output stage includes an inverter to receive a signal from the domino stage conductor and to provide an evaluated output signal on an output conductor, the output stage including a duplicate evaluation path circuit coupled to an output conductor.

16 Claims, 9 Drawing Sheets

OTHER PUBLICATIONS

Shigematsu, Satoshi, et al., "A 1–V High–Speed MTCMOS Circuit Scheme for Power–Down Application Circuit," IEEE Journal of Solid–State Circuits, vol. 32, No. 6, Jun. 1997, pp. 861–869.

Wang, Zhongde, et al., "Fast Adders Using Enhanced Multiple–Output Domino Logic," IEEE Journal of Solid–State Circuits, vol. 32, No. 2, Feb. 1997, pp. 206–214.

Waste, Neil H. E., et al., Principles of CMOS VLSI Design: A Systems Perspective, Second Edition, Addison–Wesley Publishing Company, pp. 308–311. (1993).

Zhang, Hui, et al., "Low–Swing Interconnect Interface Circuits," Proceedings of Int'l Symp. on Low Power Electronics and Design, Aug. 10, 1998, pp. 161–166.

* cited by examiner

DOMINO CIRCUITS WITH HIGH PERFORMANCE AND HIGH NOISE IMMUNITY

BACKGROUND OF THE INVENTION

1. Technical Field of the Invention

The present invention relates to circuits and, more particularly, to domino circuits.

2. Background Art

Wide-fanin gates are gates having numerous input ports. Wide-fanin gates are routinely employed on critical delay paths of high-performance datapaths, such as in a microprocessor, digital signal processor, or other semiconductor device. Dynamic/Domino logic techniques have been used to achieve substantially higher performance than are provided by static complementary metal oxide semiconductor (CMOS) technology for wide-fanin gates. For example, referring to FIG. 1, a conventional prior art domino OR gate 10 includes multiple inputs signals A1 . . . An to n-channel field effect transistors (nFET devices) M1-1 . . . M1-n, where n may be 2 or more. In a wide-fanin gate, n is considerably greater than 2. Gate 10 also includes a precharge p-channel field effect transistor (pFET device) M2, a keeper pFET device M3, and a static CMOS output stage 14, which is an inverter. During a precharge phase, input signals A1 . . . An are predischarged to Vgnd and a clock signal (Clk) goes low. When Clk goes low, pFET device M2 is turned ON and a domino stage output signal Q is pulled high to Vdd. As signal Q goes high, an inverter 18 turns on pFET device M3 which keeps signal Q high after Clk transitions high, which turns off pFET device M2. During an evaluation phase, if one or more of input signals A1 . . . An goes high, the corresponding nFET device(s) M1-1 . . . M1-n is turned ON pulling signal Q low (Vgnd). When signal Q goes low, an evaluated output signal out at the output of output stage 14 goes high.

Performance is measured by how quickly signal Q goes low and the evaluated output signal goes high. However, the noise immunity of these techniques degrades with process scaling due at least in part to increasing domino-stage transistor leakage current. Recently, strategies to restore back the noise immunity have been proposed: these strategies involve modifying the gate structure by either employing multiple threshold voltages or noise-tolerant pMOS pull-up stages. However, these modifications reduce the performance advantage enjoyed by domino logic techniques over conventional static CMOS techniques.

Accordingly, there is a need for domino circuits with high performance and high noise immunity.

SUMMARY

In some embodiments, the invention includes a domino circuit having a precharge circuit including a source follower nFET device coupled to a domino stage conductor. An evaluation path circuit is also coupled to the domino stage conductor. A hysteretic output stage receives a signal from the domino stage conductor and provide therefrom an evaluated output signal.

In other embodiments, the invention includes a domino circuit having a predischarge circuit coupled to a domino stage conductor. An evaluation path circuit includes source follower NFET devices coupled to the domino stage conductor. A hysteretic output stage receives a signal from the domino stage conductor and provides therefrom an evaluated output signal.

In still other embodiments, the invention includes a domino circuit having a precharge circuit including coupled to a domino stage conductor. An evaluation path circuit is coupled to the domino stage conductor. An output stage includes an inverter to receive a signal from the domino stage conductor and to provide an evaluated output signal on an output conductor, the output stage including a duplicate evaluation path circuit coupled to an output conductor.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

Figure 1:
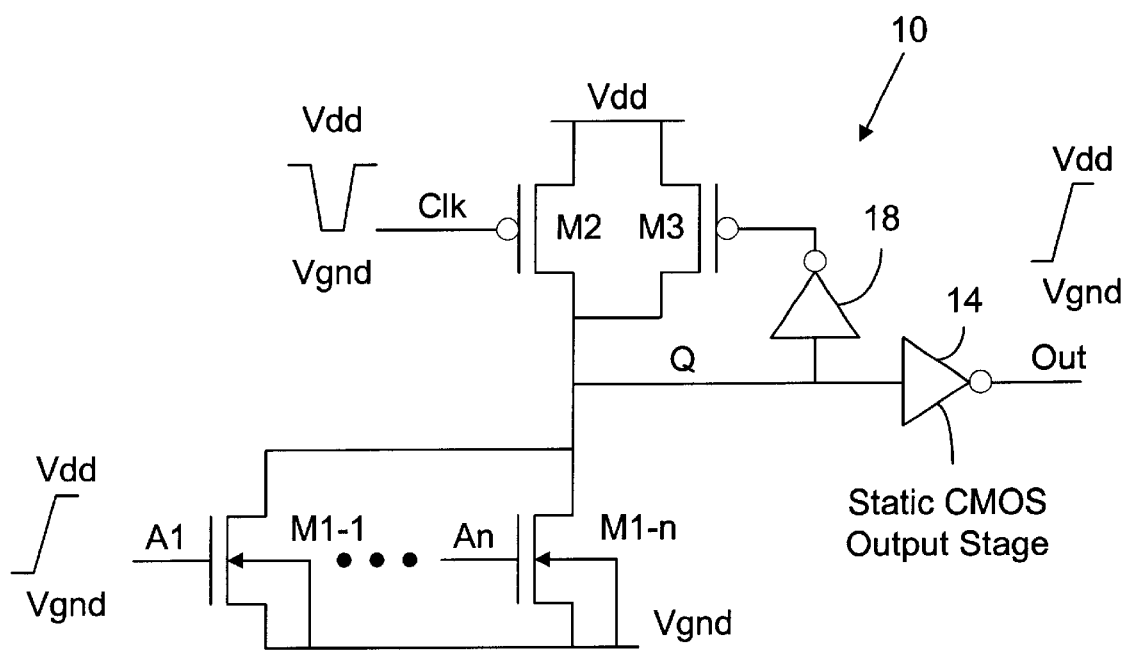
FIG. 1 is a schematic representation of a prior art domino circuit.

A. Source Follower Domino Circuits
  1. Precharged Domino Circuit
  2. Predischarged Domino Circuits
B. Output Stages with Hysteresis
C. Controlling the Threshold Voltage with Body Bias
D. Full Swing P-Boosted Domino Circuits
E. Domino Circuit with an Evaluation Path Enhanced Output Stage
F. Other Information and Embodiments A. Source Follower Domino Circuits
  1. Precharged Domino Circuit Referring to FIG. 2, a precharge domino OR gate circuit 30 includes a precharge circuit 32 including an nFET device M5. Circuit 30 also includes an evaluation path circuit 34 including nFET devices M4-1 . . . M4-n having inputs signals A1 ... An, where n may be 2 or more. In a wide-fanin gate, n may be considerably greater than 2. During a precharge phase when a clock signal (Clk) is high, nFET device M5 precharges a domino stage output signal Q to Vdd-Vt, where Vt is the threshold voltage of nFET device M6. Each transistor may have the same threshold voltage or different transistors may have different threshold voltages. During the precharge phase, the primary gate input signals A1 ... An are precharged to Vgnd to prevent static power consumption. When Q goes high, an inverter 36 provides a low signal to an inverter 38, which turns on nFET device M6. Keeper device M6 keeps signal Q high after Clk transitions low, which turns off nFET device M5. Keeper device M6 and inverters 36 and 38 are optional in that they are not needed in every embodiment of circuit 30.

During an evaluation phase, if one or more of input signals A1 ... An goes high, the corresponding nFET device(s) M4-1 ... M4-n is turned ON pulling signal Q low (Vgnd). Accordingly, Q swings between Vgnd and Vdd-Vt, absent noise. Signal Q is provided on conductor 40 to an output stage 42, which provides an evaluated output signal Out. Various circuits may be used for output stage 42, some of which are described in detail below. One such circuit may be a simple CMOS inverter, as is used in the prior art. A disadvantage with using a simple CMOS inverter is that there may be some static current when signal Q is Vdd-Vt, particularly as noise is introduced. In some embodiments, output stage 42 also provides an output signal Out*, which is the complement of output signal Out. In this respect, in some situations, Q may be treated as Out*, although the state of an Out* signal from output stage 42 might continue after Q is precharged in the next cycle. If none of input signals A1 ... An goes high, the signal Q remains high and the signal Out remains low.

NFET devices M5 and M6 are source follower devices that when turned ON pull signal Q to Vdd-Vt. Since the voltage swing across the domino output capacitance on conductor 40 is reduced, a linear dynamic power reduction may be achieved compared to a full-swing implementation. The power savings may be obtained without employing any additional power rails, thereby offering significant layout area savings as well. The reduced voltage swing across the domino output capacitance may result in a nearly linear reduction in delay compared to full-swing operation. This delay improvement may be achieved without a loss in the driving transistors' on-drive voltage (Vgs). Prior art static CMOS-based low-swing techniques suffer from a linear reduction in on-drive voltage with reducing voltage swings and hence offer a much lesser delay improvement. Using source follower devices also increases the switching speed of circuit 30 as compared to a conventional domino circuit because of a faster swing. However, a problem with precharging to only Vdd-Vt with a prior art inverter output stage is that the noise margin may be decreased because the high voltage range is closer to a trip point. In some embodiments, output stage 42 is a hysteretic swing restoring static stage (described below) that restores noise margin and reduces or eliminates static leakage.

Although circuit 30 is illustrated as an OR gate, the source follower precharge circuit 32 of circuit 30 and the other various features of the invention described below may be used in connection with AND, NAND, NOR and other more complicated gates. For example, in an AND gate, transistors M4-1 ... M4-n would be stacked rather than in parallel.

2. Predischarged Domino Circuits

Figure 3:
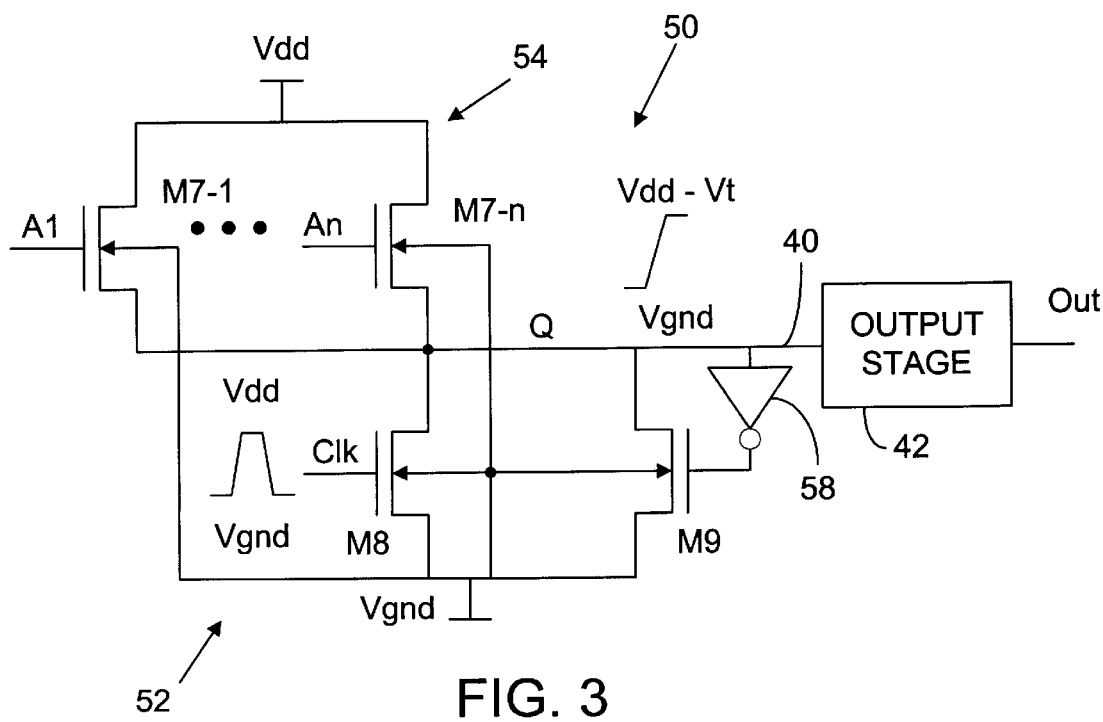
FIG. 3 is a schematic representation of a predischarge domino circuit according to some embodiments of the invention.

Referring to FIG. 3, a predischarge domino gate circuit 50 includes a predischarge circuit 52 including an nFET device M8. Circuit 50 also includes an evaluation path circuit 54 including nFET devices M7-1 ... M7-n having inputs signals A1 ... An, where n may be 2 or more. Circuit 50 may be a wide fan-in circuit. During a predischarge phase when a clock signal (Clk) is high, nFET device M8 predischarges a domino stage output signal Q to Vgnd. During the predischarge phase, the primary gate input signals A1 ... An are predischarged to Vgnd to prevent static power consumption. When Q goes low, an optional inverter 58 turns ON an optional nFET keeper device M9 that keeps signal Q low after Clk transitions low, which turns off nFET device M8.

During an evaluation phase, if one or more of input signals A1 ... An are high, the corresponding one(s) of nFET devices M7-1 ... M7-n is turned ON, and signal Q is pulled to Vdd-Vt, where Vt is the threshold voltage of the one(s) of nFET device(s) M7-1 ... M7-n that is/are ON. Each transistor may have the same threshold voltage or some transistors may have different threshold voltages. The signal Q is provided on a conductor 40 to output stage 42, examples of which are provided herein, which provides the evaluated output signal Out.

One advantage in using nFET devices in the evaluation path circuit of a predischarged domino circuit rather than pFET devices concerns size. The transconductance of an nFET device is roughly 2 to 2½ times that of a pFET device of the same size. Accordingly, nFET devices M7-1 ... M7-n may be made much smaller that a pFET device for the same pulling up speed, or pull up faster for the same size, or have a combination of smaller size and greater speed. Circuit 50 may have very low leakage current if the nFET devices are selected to be small in size. With smaller pull-up devices, for the same amount of tolerable leakage, there may be more pull-up devices, and hence a greater number of inputs (wider fan-in) to the logic gate. Just as an example, in some embodiments, the number of inputs could be 72 (or a greater or less number). For the same performance and leakage, were pFET pull-up devices used, there would be fewer inputs (a less wide fan-in).

Figure 2:
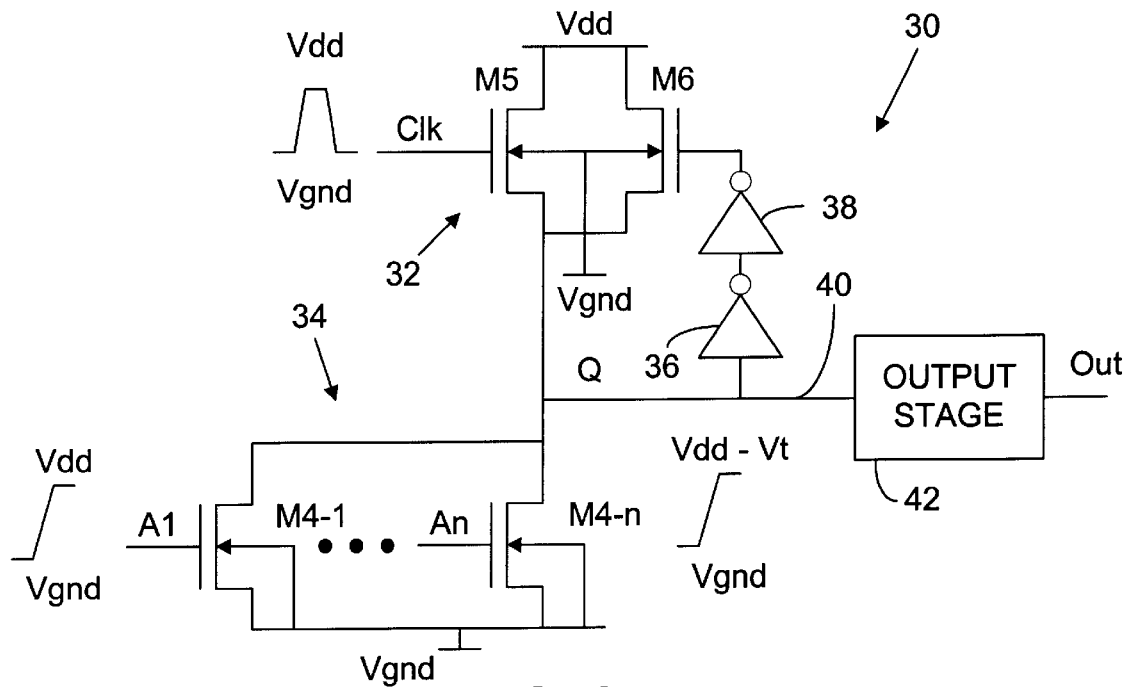
FIG. 2 is a schematic representation of a precharge domino circuit according to some embodiments of the invention.

Circuits 30 and 50 in FIGS. 2 and 3 have significantly higher drain-source impedance to power supply when the input signal is at Vdd-Vt than do prior art full-swing domino circuits. This results in substantially improved power supply noise rejection.

As described above, if a conventional inverter output stage is used, having signal Q swing from Vgnd to Vdd-Vt reduces noise immunity (and also reduces power consumption). Accordingly, output stage 42 may be a hysteretic output stage, described below, which provides high noise immunity.

B. Output Stages with Hysteresis

Figure 4:
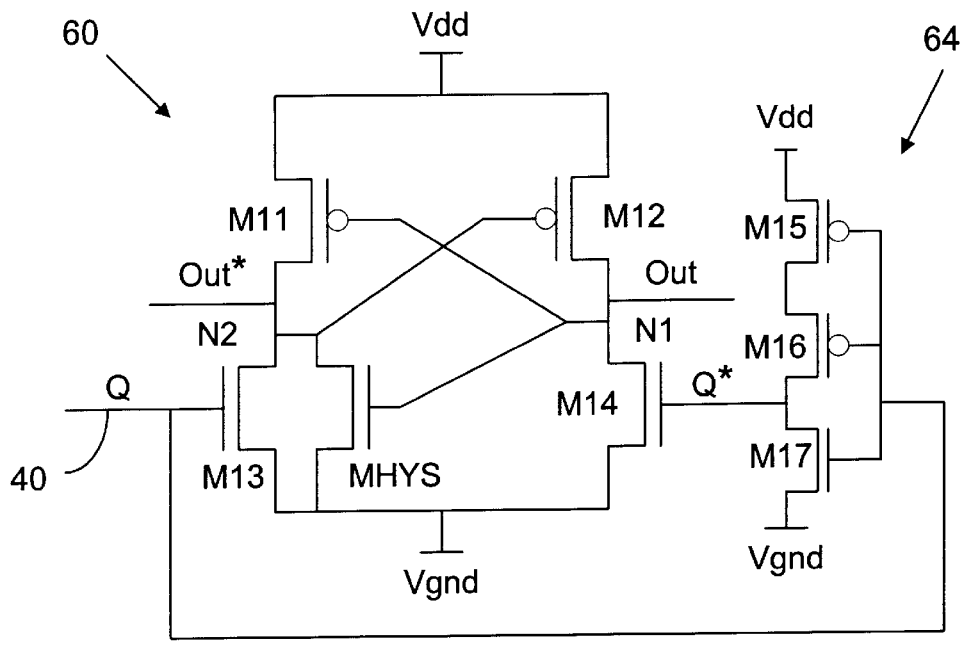
FIG. 4 is a schematic representation of an output stage according to some embodiments of the invention.
Figure 5:
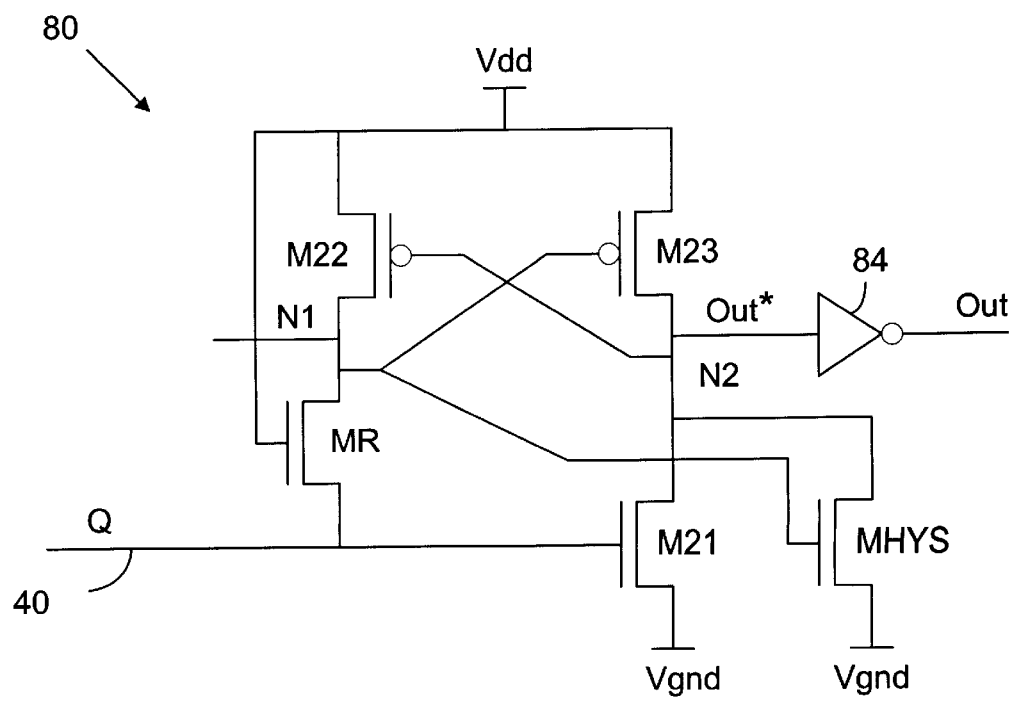
FIG. 5 is a schematic representation of an output stage according to some embodiments of the invention.

FIGS. 4 and 5 provide examples of output stage circuits 60 and 80 with hysteresis that may be used for output stage 42 in FIGS. 2 and 3. Other output stage circuits, with or without hysteresis may be used for output stage 42.

Where Q swings between 0 and Vdd-Vt, the noise margin between Vdd-Vt and Vdd/2 is relatively low. Noise that would not cause Vdd to dip below Vdd/2, may cause Vdd-Vt to dip below Vdd/2. Referring to FIG. 4, to solve this problem, a hysteretic output stage 60 requires signal Q to go substantial below the upward going trip point to trip a high to low transition. Output stage 60 provides high noise immunity but also allows the performance and power savings advantage of a mixed swing technique.

Referring to FIG. 4, in the following description, it is assumed Q swings between Vgnd and Vdd-Vt, absent noise, but output stage 60 will provide hysteresis and the description is largely applicable if Q swings between Vgnd and Vdd or some other high value, absent noise. Output stage 60 includes an output signal Out with a voltage Vout that follows the voltage Vin of single ended interconnect signal Q (as opposed to a differential input). It may also be desirable to have a Out* signal, which is the complement of Out. In FIG. 4, Out is at node N1 and Out* is at node N2. The voltage of Out and Out* could be increased by putting an inverter at nodes N1 and N2 and having Out be at the output of the inverter on node N2 and Out* be at the output of the inverter on node N1.

Figure 6:
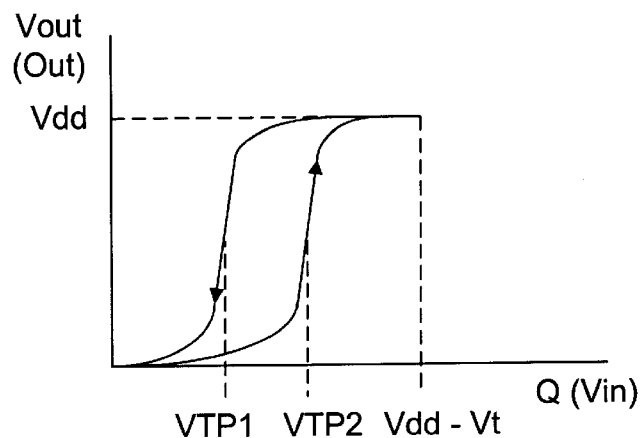
FIG. 6 is a graph illustrating hysteretic features of the output stages of FIGS. 4 and 5.

The hysteretic nature of output stage 60 is illustrated with FIG. 6 (which may be somewhat idealized) wherein a forward trip point (low to high voltage) VTP2 of Q(Vin) at which Out switches from a low to high voltage is significantly higher than a reverse trip point VTP1 (high to low voltage) of Vin at which Out switches from a high to a low voltage. As an example, VTP2 may be Vdd/2 (or another value).

Output stage 60 includes inverter 64, having pFET devices M15 and M16 and an nFET device M17, the output of which is a signal Q* which is the complement of Q. When Q is low, an nFET device M13 is OFF, Q* is high, M14 is ON, Out is low, an nFET device Mhys (for hysteresis) is OFF, a pFET device M11 is ON pulling node N2 high turning OFF a pFET device M12. pFET devices M11 and M12, which are cross-coupled together, and nFET devices M13 and M14, which receive signals Q and Q*, look similar to a cascode voltage switched gate. However, they differ from a cascode voltage switched gate because of the inclusion of nFET device Mhys.

When Q is changed from Vgnd (low) to Vdd-Vt, which is greater than VTP2, M13 turns ON, pulling down node N2, which turns M12 ON. With M12 ON, node N1 is pulled up. Contention between M12 and M14 is quickly resolved because with Q being high, M15 and M16 turn OFF, and M17 turns ON pulling Q* low. With Q* low, M14 turns OFF. As node N1 is pulled high, transistor M11 is turned OFF and transistor Mhys is turned ON to accelerate the fall of node N2. Accordingly, transistor M12 is turned on stronger as transistor M14 is turned OFF.

The nFET device Mhys contributes to the hysteretic output stage 60 as follows. When Mhys is at ground, it acts as a drain follower device (i.e., the drain follows the inverse of the input Q) with the gate tied to Vdd. Node N2 is pinned to Vgnd by Mhys. If Q goes below the trip point VTP2 because of noise, M13 starts to turn OFF, but transistor Mhys will continue to be ON keeping node N2 low and M12 ON. M15 and M16 may turn partially ON and M17 may turn partially OFF so that Q* is higher such that M14 may turn partially ON. There may be some contention between M12 and M14, but not enough to pull node N1 low and completely turn Mhys OFF. However, if Q is pulled low, below VTP1, M13 will turn OFF, Q* will be pulled high turning M14 ON, which will pull node N1 low and turn OFF Mhys and turn ON M11. With node N2 high, M12 turns OFF. Generally speaking, the reverse trip point VTP1 is the point at which these other effects of output stage 60 can overcome the hysteretic effect of Mhys. By properly sizing devices Mhys and parameters such as the size of M11, M12 and perhaps M14, a proper reverse trip point VTP1 may be selected and the desired noise immunity be provided. As well as significantly contributing to the hysteresis, Mhys increases the speed at which node N2 is pulled down, adding to the overall speed (and decreasing the delay) of output stage 60.

In the case in which Q is Vdd-Vt, M17 will be ON, but M15 and M16 might not be completely OFF. Accordingly, there may be a small amount of static current through M15 and M16. By stacking M15 and M16, that amount of static current is significantly reduced. The stack of Ml5 and M16 also reduces leakage current which helps with noise immunity. When a device is leaky, it may act like a biased amplifier and tend to be near a precipice of switching.

Referring to FIG. 5, a hysteretic output stage 80 has a forward trip point VTP2, which is greater than a reverse trip point VTP1, similar to that shown in FIG. 6. Output stage 80 includes nodes N1 and N2. As illustrated, output stage 80 includes an inverter 84. An output signal Out (having a voltage Vout) is provided the output of inverter 84. To the extent a signal Out* (the complement of Out) is desired, it can be obtained at node N2 or at the output of another inverter (not shown) in series with inverter 84. Out may be at node N1. It is assumed Q is a low voltage swing signal (between Vgnd and Vdd-Vt, absent noise), but output stage 80 will provide hysteresis and the description is largely applicable if Q swings between Q and Vdd or some other high value, absent noise.

As explained above, in output stage 60, static power is reduced, but not eliminated. In output stage 80, the static power is eliminated. Assuming signal Q switches from 0 to Vdd-Vt, when Q is high, nFET device M21 turns ON and pulls node N2 low, turning on a pFET device M22. When M22 is ON, a node N1 goes high, which turns a pFET device M23 OFF. With node N1 high, an nFET device Mhys is turned ON accelerating the fall of node N2. Accordingly, Mhys increases the speed at which Out switches to high. An nFET device MR (called a riding device) has its gate tied to Vdd. MR is ON when Q is low, because Vgs is roughly Vdd. However, as Q goes from 0 to Vdd-Vt, Vgs is Vdd-(Vdd-Vt)=Vt, which roughly the Vt of MR. (It is assumed that the Vts of the transistors is roughly equal to the Vt of the precharge circuit, although that is not required.) Accordingly, MR turns OFF. There is not a static (DC) path between power supply Vdd and ground. When Q is at Vdd-Vt, MR does see a direct path from Vdd to ground so that there is no DC current through MR. Accordingly, with output stage 80 there is hysteretic noise immunity without having a DC path from Vdd to ground.

The drain to source resistance of MR is very high when Vgs≦Vt. Q is protected from power supply by the very high impedance. Accordingly, signal Q is isolated from noise on Vdd (power supply) because of high impedance when input at Vdd-Vt. This offers substantially improved output stage power supply noise rejection as compared to a conventional static CMOS output stage.

If noise on signal Q pulls signal Q below VTP2, M21 will be partially turned OFF. Further, node N1 will be lowed somewhat through device MR, which will begin to turn ON. However, if Q does not go below VRP1, node N1 will continue to keep Mhys ON enough to keep node N2 low and node N1 will not be low enough to sufficiently turn ON M23 to pull up node N2. If signal Q goes below VTP1, M21 will turn substantially OFF, MR will turn ON sufficiently to pull node N1 low, which will turn OFF Mhys. Further, with node N1 low, M23 will turn ON, pulling up node N2 and turning OFF M22.

C. Controlling the Threshold Voltage with Body Bias

Figure 7:
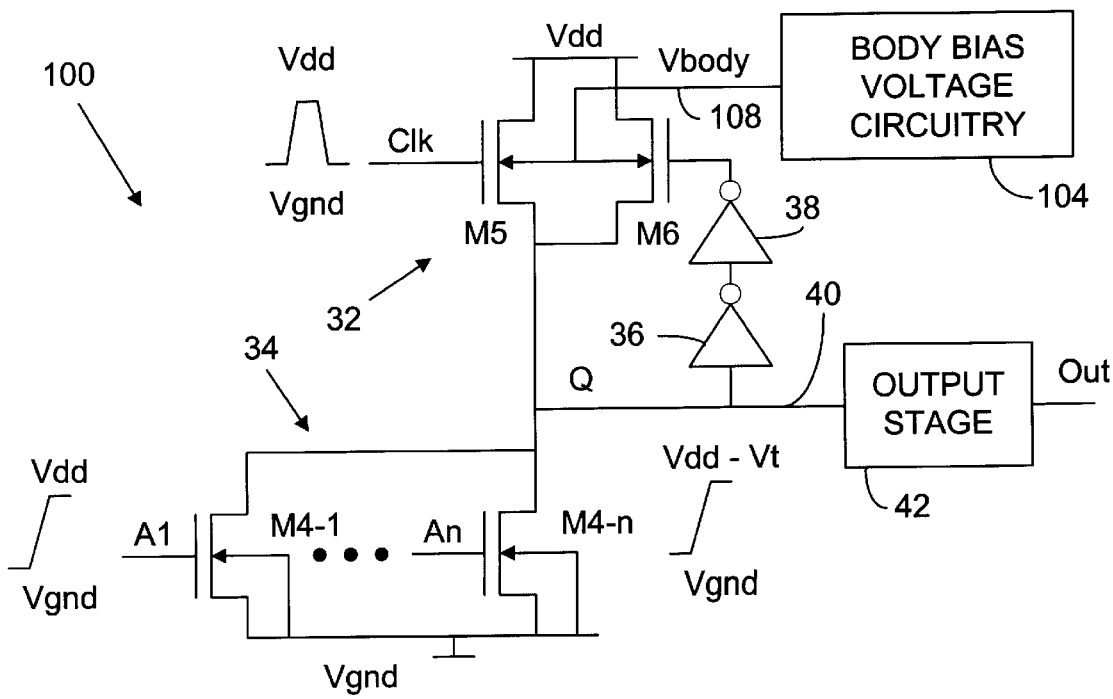
FIG. 7 is a schematic representation of the domino circuit of FIG. 2 with body bias voltage circuitry.

The threshold voltage Vt of nFET devices M5 and M6 can be changed by changing the bias voltage Vbody applied to the body (or bodies) of M5 and M6. Referring to FIG. 7, a circuit 100 is like circuit 30 (in FIG. 2) except as follows. In circuit 30, the body (or bodies) of devices M5 and M6 are tied to Vgnd, so there is a zero bias. In circuit 100, the body (bodies) of devices M5 and M6 are connected to the output of body bias voltage circuitry 104. Circuit 104 provides a voltage Vbody on a conductor 108, which may be greater than Vgnd (in which case devices M5 and M6 are forward biased), equal to Vgnd, or less than Vgnd (in which case devices M5 and M6 are reverse biased). A forward bias of the source-drain junction reduces the circuit devices' threshold voltage, contributing to further delay improvement but may increase power consumption. Conductor 108 may be connected to various places including body taps and the bottom of the substrate. Body bias voltage circuitry 104 may include feedback circuitry to keep the high voltage state of Q at a desired value or maintain another parameter(s). Devices M5 and M6 may share a common body (although they may be referred to as separate bodies) or, for example, have separate bodies in different wells. Transistors in circuit 100 (and in other circuits illustrated and/or described herein) other than device M5 and M6 may also have the Vbody voltage applied to them. Alternatively, different transistors could have different bias voltages. If wells are isolated from each other, the voltage at one body does not influence the voltages at another body.

D. Full Swing P-Boosted Domino Circuits

Figure 8:
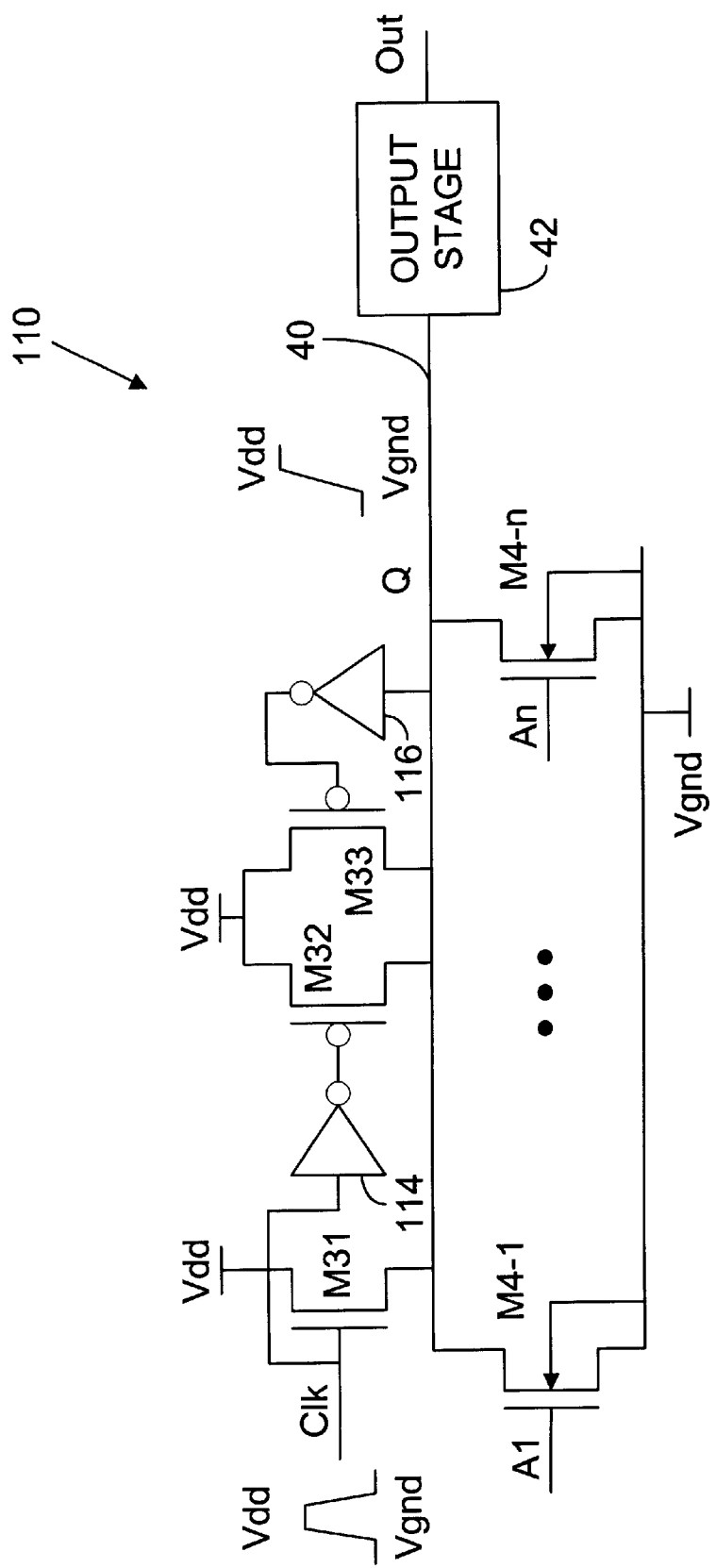
FIG. 8 is a schematic representation of a p-boosted precharge domino circuit according to some embodiments of the invention.

As mentioned, there may be a reduction in noise immunity where signal Q is pulled to only Vdd-Vt. However, the prior art domino circuits which pull signal Q to a full rail Vdd use a relatively large pFET precharge device. The present invention includes embodiments that use relatively small pFET devices to provide full rail signals. For example, referring to FIG. 8, a precharge domino circuit 110 is similar to circuit 30 (in FIG. 2). However, circuit 110 includes an inverter 114 that provides an inverted signal Clk to the gate of a pFET pull-up device M32. When Clk is high, a precharge nFET device M31 pulls signal Q to Vdd-Vt on conductor 40, where Vt is the threshold voltage of device M31. After the delay of inverter 114, pFET pull-up device M32 pulls signal Q to Vdd. The bulk of the pulling up work can be done by nFET device M31. An nFET device has roughly 2 to 2½ times the transconductance as does a pFET device of the same size. Because they have to do relatively little work, pFET device 32 and the transistors of inverter 116 may be relatively small in size in comparison to pFET pull-up devices in prior art domino circuits. Accordingly, circuit 110 can avoid using a large pFET pull-up device, which is used in prior art domino circuit. Accordingly, circuit 110 may have high performance through a powerful nFET device M31, yet low leakage and small size. Output stage 42 may be a conventional inverter, which will consume little if any static power because Q is at Vgnd or Vdd, or output stage 42 may be another circuit, for example, like that in FIGS. 4 or 5.

Circuit 110 includes an optional inverter 116 and keeper pFET transistor M33 to keep signal Q high. pFET device M33 and the transistors in inverter 114 may be relatively small. The pulling up power of pFET device M33 should be relatively easy to overcome by one of nFET devices M4-1 . . . M4-n.

Figure 9:
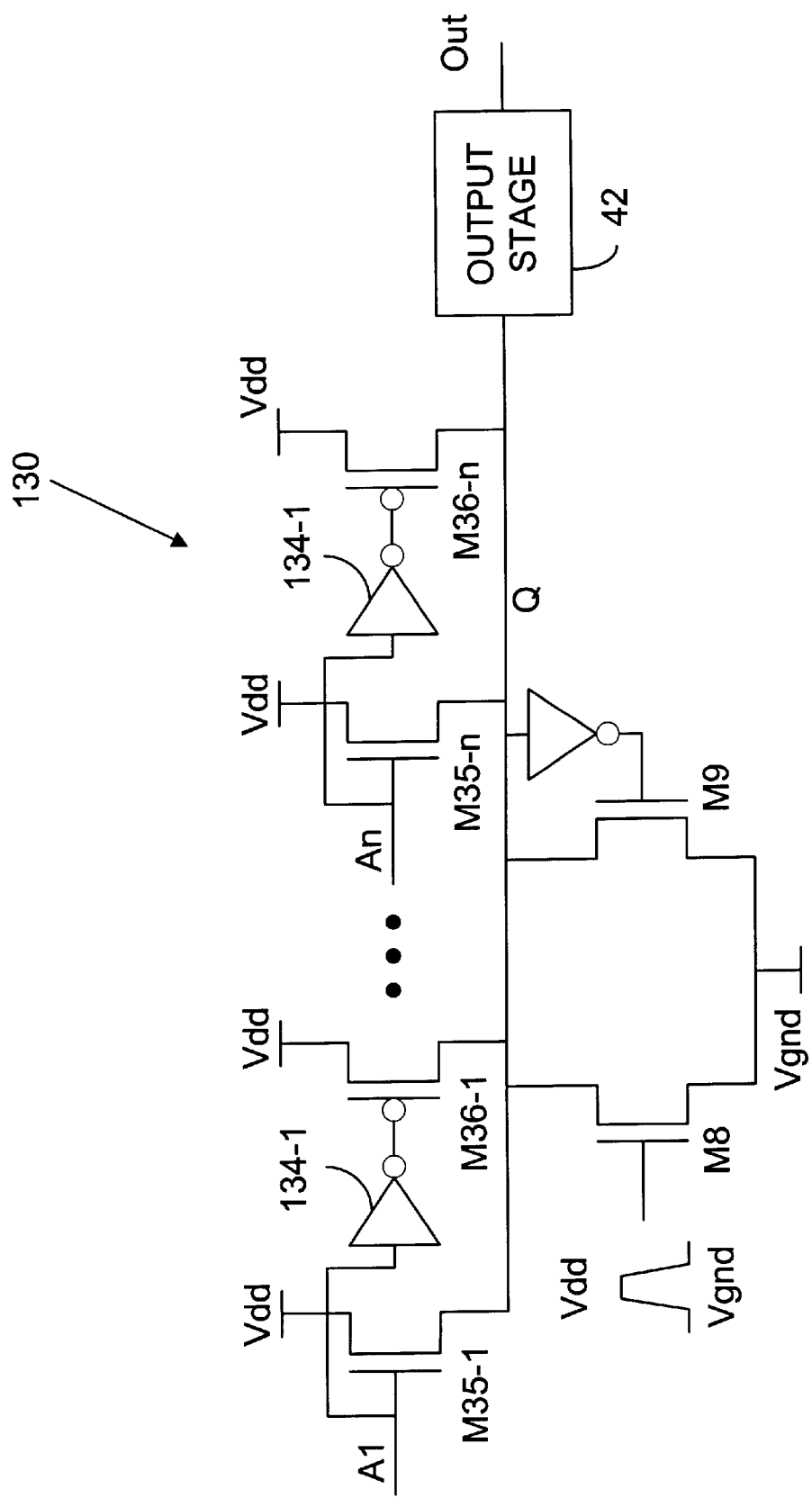
FIG. 9 is a schematic representation of a p-boosted predischarge domino circuit according to some embodiments of the invention.

Referring to FIG. 9, a predischarge domino circuit 130 is similar to circuit 50 (in FIG. 3). However, in addition to including nFET devices M35-1 . . . M35-n, one or more of which selectively pull up signal Q to Vdd-Vt, circuit 130 also includes pFET pull-up devices M36-1 . . . M36-n, one or more of which selectively pull up signal Q to a full rail Vdd. Small delays are provided by inverters 134-1 . . . 134-n such that the selected nFET device(s) of M35-1 . . . M35-n does most of the work in pulling up signal Q to Vdd-Vt, but selected pFET devices M36-1 . . . M36-n pull up signal Q to Vdd.

pFET devices M36-1 . . . M36-n may be considerably smaller than evaluation path pFET devices in a prior art predischarge domino circuit. Likewise, the transistors of inverters 134-1 . . . 134-n may be relatively small. In the case in which circuit 130 includes a wide fan-in evaluation path circuit, the savings in size can be considerable for each gate. Further, with smaller transistors, there is less leakage. With smaller pull-up devices, for the same amount of tolerable leakage, there may be more pull-up devices, and hence a greater number of inputs (wider fan-in) to the logic gate. For example, in some embodiments, the number of inputs could be 72 or some greater or lesser number. For the same performance and leakage, were pFET pull-up devices used, there would be fewer inputs (less wide fan-in). In general , the nFET pull-up devices take up less die space for the same performance and leakage.

E. Domino Circuit with an Evaluation Path Enhanced Output Stage

The switching speed of a domino circuit can be enhanced by duplicating the evaluation path circuit at the output stage. The duplicated evaluation path circuit can begin to pull up on the output signal Out before other circuitry in the output stage (such as an inverter) begins switching. For example, referring to FIG. 10, a domino logic gate circuit 150 includes an evaluation path enhanced output stage 154. Circuit 150 includes a precharge pFET device M41 and an evaluation path circuit 152 including nFET devices M42-1 . . . M42-n having input signals A1 . . . An. Output stage 154 includes an inverter 156 formed of a pFET device M44 and an nFET device M45 and an evaluation path circuit 158 (including nFET devices M46-1 . . . M46-n) which is a duplicate of evaluation path circuit 152. Although circuitry 150 is not illustrated with a keeper transistor and associated inverter, it could include them. During a precharge phase, input signals A1 . . . An are predischarged to Vgnd and a clock signal (Clk) goes low. When the signal Clk transitions low, pFET device M41 turns ON pulling a signal Q high to Vdd.

Consider the following two cases. (1) If during the evaluation phase, each of signals A1 . . . An remains low, signal Q remains high, and an output signal Out remains pulled low by nFET device M45 in inverter 156. nFET devices M46-1 . . . M46-n remain OFF. (2) If during the evaluation phase, any of input signals A1 . . . An are high, the selected nFET device(s) M42-1 . . . M42-n is/are turned ON pulling signal Q low. pFET device M44 pulls signal Out high. The selected nFET device(s) M46-1 . . . M46-n is/are turned ON pulling signal Out high faster than if merely pFET device M44 did the work. Because of delays through nFET devices M42-1 . . . M42-n, the nFET device(s) M46-1 . . . M46-n may begin to turn ON before pFET device M44 begins to turn ON. Although the nFET device(s) M46-1 . . . M46-n will only pull to Vdd-Vt, pFET device M44 will pull Q completely to Vdd. Accordingly, pFET device M44 does not have to be made as large and Out will be pulled up more quickly.

Figure 10:
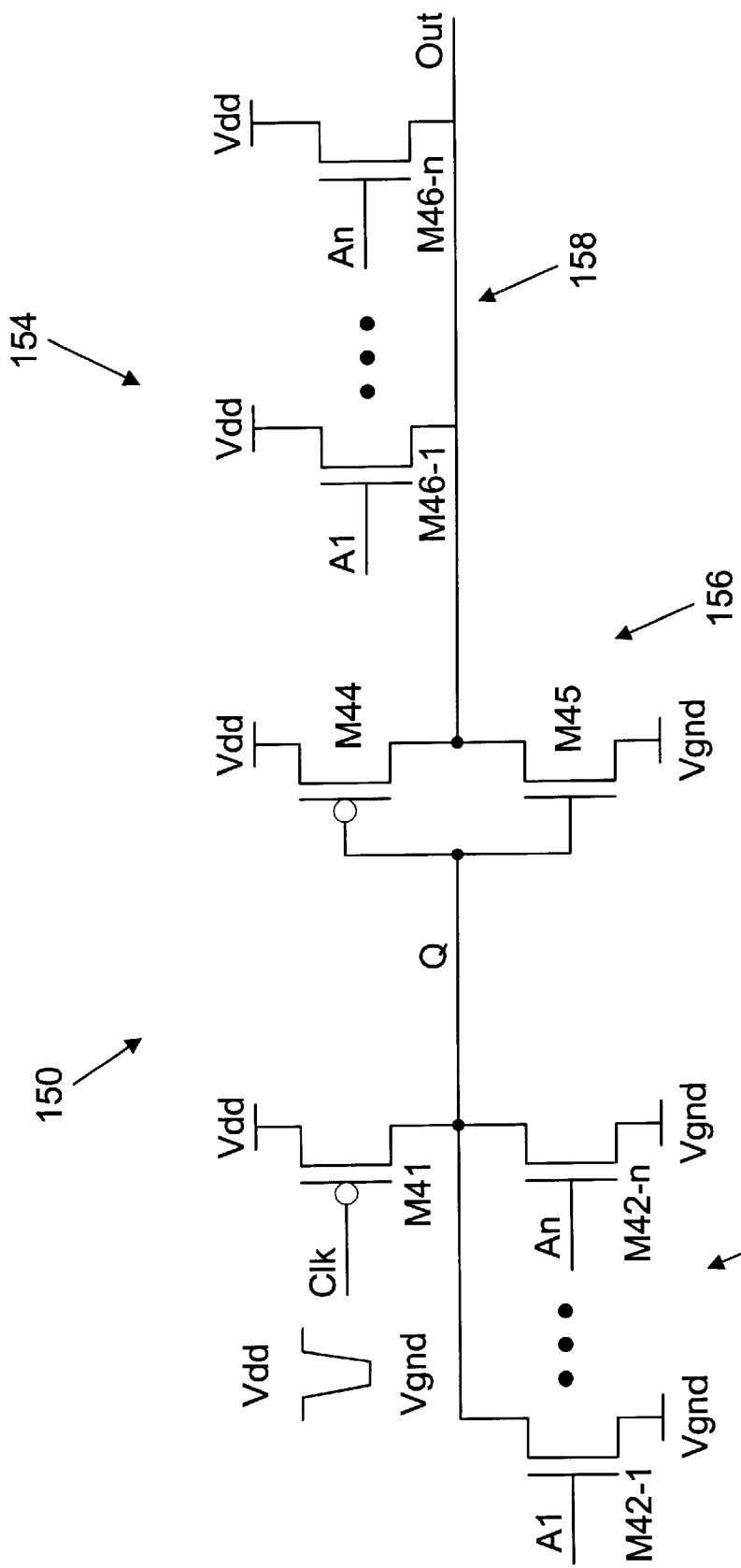
FIG. 10 is a schematic representation of a domino circuit with an evaluation path enhanced output stage according to some embodiments of the invention.

In different embodiments, a domino circuit with an evaluation path logic enhanced output stage may include additional or different features than those shown in FIG. 10. For example, FIG. 10 includes a precharge circuit with a pFET pull-up transistor. Alternatively, the precharge circuit could have used an nFET pull-up transistor (as in FIGS. 2 and 3) with an inverted clock signal. FIG. 10 includes a precharge circuit to pull-up signal Q and an evaluation path circuit to selectively pull down signal Q. Alternatively, a domino circuit with an evaluation path logic enhanced output stage could include a pre-discharge circuit to pull-down signal Q and an evaluation path circuit to selectively pull up signal Q (similar to that in FIG. 3). Also, the pull-up evaluation path circuit could comprise nFET transistors (as in FIG. 3). The transistors of the evaluation path circuit in the output stage could be replaced with pFET transistors, although this would involve providing them inverted input signals A1 . . . An and the pFET transistors may need to be larger than the nFET transistors of circuit 150.

Figure 11:
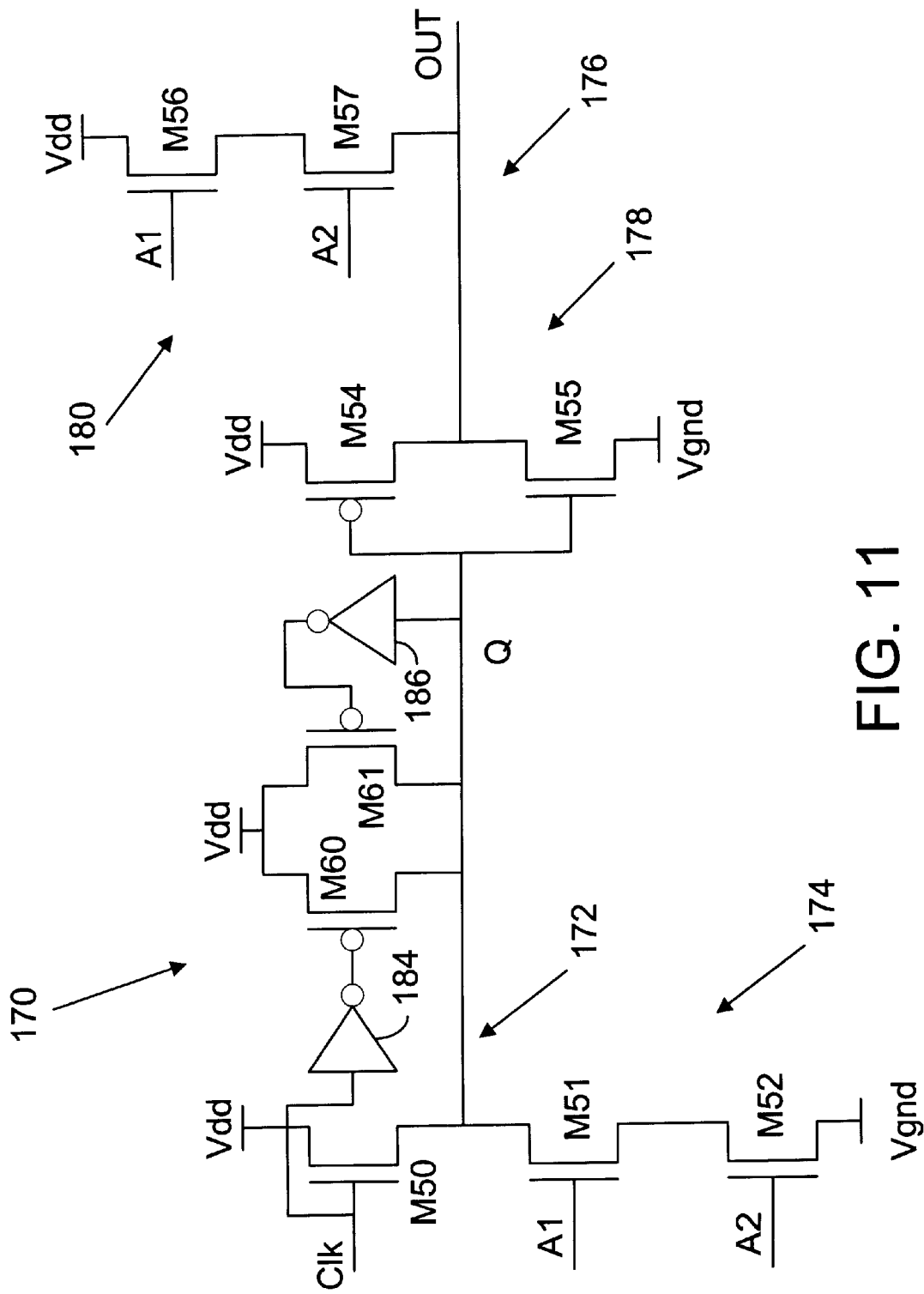
FIG. 11 is a schematic representation of a domino circuit with an evaluation path enhanced output stage according to some embodiments of the invention.

FIG. 11 illustrates a domino logic AND circuit 170 with an evaluation path enhanced output stage. In circuit 170, a precharge circuit 172 includes an nFET pull-up device M50. Evaluation path circuit 174 includes two stacked nFET transistors M51 and M52 (although more than two stacked transistors could have been included). An output stage 176 includes an inverter 178 including a pFET device M54 and an nFET device M55. Output stage 176 also includes an evaluation path circuit 180 (including nFET transistors M56 and M57) which is a duplicate of evaluation path circuit 174. Circuit 170 illustrates an optional p-booster pFET device M60 and associated inverter 184. nFET device M50 pulls a domino stage output signal Q to Vdd-Vt. PFET device M60 pulls signal Q up to Vdd. Precharge circuit 172 is said to be p-boosted. PFET device M60 may be relatively small. Circuit 170 also illustrates an optional keeper pFET device M61 and associated inverter 186. During an evaluation stage, signal Q is precharged to Vdd and inputs A1 and A2 are predischarged to Vgnd.

Consider the following two cases. (1) If during the evaluation phase, either of signals A1 and A2 remains low, signal Q remains high, and an output signal Out is pulled low by nFET device M55 in inverter 178. At least one of nFET devices M56 and M57 remain OFF. (2) If during the evaluation phase, both input signals A1 and A2 are high, the associated nFET devices M51 and M52 are turned ON pulling signal Q low. pFET device M54 pulls signal Out high. The nFET devices M56 and M57 are turned ON pulling signal Out high. The nFET devices M56 and M57 may begin to turn ON even before pFET device M54 begins to turn ON. The stack of nFET devices M56 and M57 pull signal Out to only Vdd-Vt (where Vt is the threshold voltages of M56 and M57). However, pFET device 54 pulls signal Out to Vdd. For higher speed, pFET device 54 may need to be larger than in circuit 150.

Figure 12:
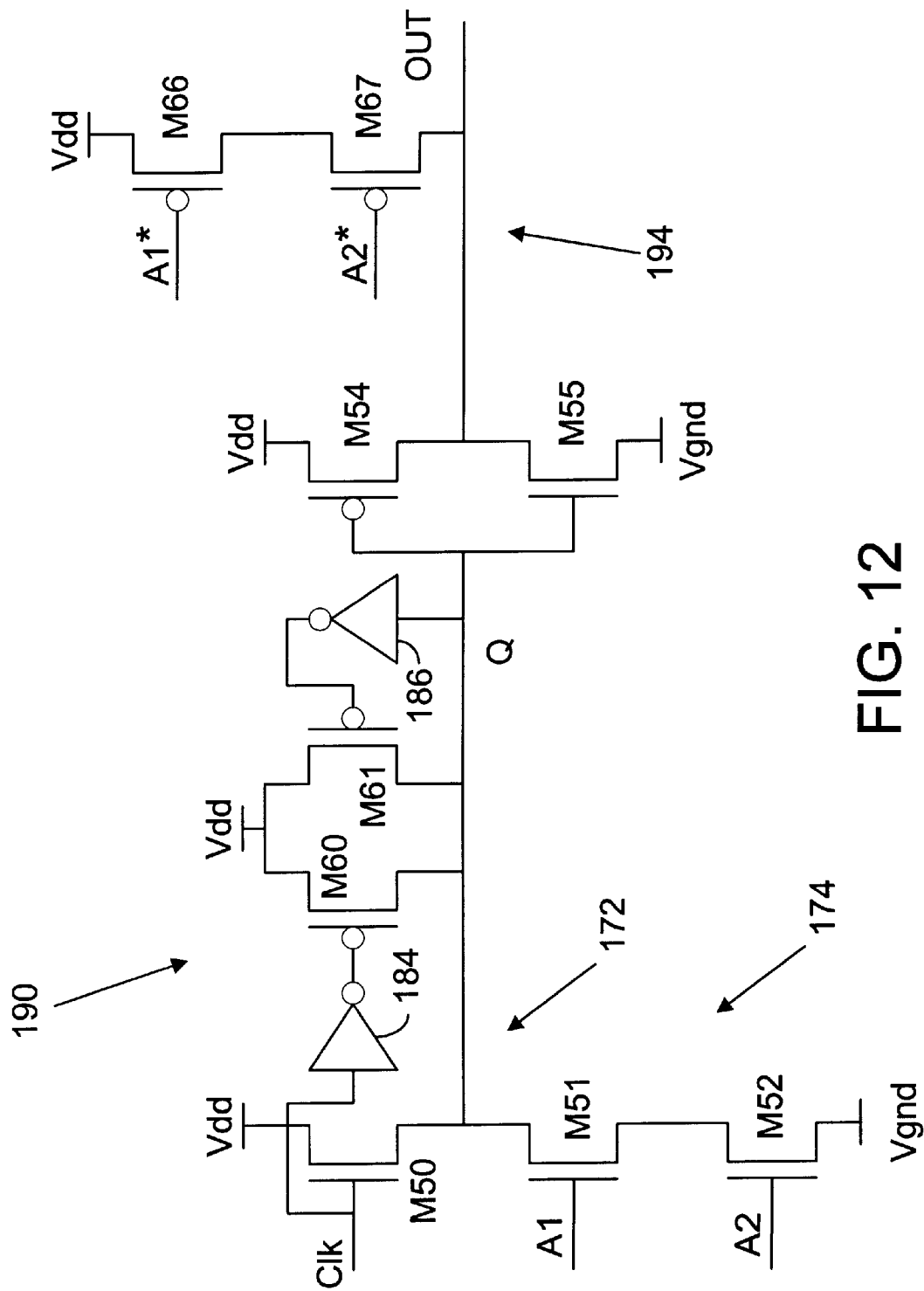
FIG. 12 is a schematic representation of a domino circuit with an evaluation path enhanced output stage according to some embodiments of the invention.

Alternatively, as shown in FIG. 12, in circuit 190, an evaluation path enhanced output stage 84 includes stacked pFET devices M66 and M67 which receive inverted A1 and A2 input signals, A1* and A2*. Since three pFET devices (M54, M66, and M67) will be pulling to Vdd, each pFET does not have to be very large to achieve high speed.

F. Other Information and Embodiments

Although in the examples described above, the signals leading to the transistors of the evaluation path circuits are predischarged to reduce power consumption, the invention is not limited to such a practice.

Although the illustrated embodiments include enhancement mode transistors, depletion mode transistors could be used.

There may be intermediate structure (such as a buffer) or signals between two illustrated structures or within a structure (such as a conductor) that is illustrated as being continuous. The borders of the boxes in the figures are for illustrative purposes and not intended to be restrictive. Arrows show certain signal flow in certain embodiments, but not every signal, such as control signals and requests for data.

If the specification states a component, feature, structure, or characteristic "may", "might", or "could" be included, that particular component, feature, structure, or characteristic is not required to be included. Reference in the specification to "some embodiments" means that a particular feature, structure, or characteristic described in connection with the embodiments is included in at least some embodiments, but not necessarily all embodiments, of the invention. The various appearances "some embodiments" are not necessarily all referring to the same embodiments.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A domino circuit, comprising:
   a precharge circuit including a source follower nFET device coupled to a domino stage conductor;
   an evaluation path circuit coupled to the domino stage conductor; and
   a hysteretic output stage to receive a signal from the domino stage conductor and to provide therefrom an evaluated output signal.

2. The circuit of claim 1, wherein the precharge circuit is p-boosted with a pFET device.

3. The circuit of claim 1, further comprising body bias voltage circuitry to provide a bias voltage to a body of the source follower device.

4. The circuit of claim 1, wherein the output stage provides a signal which is a complement of the evaluated output signal.

5. The system of claim 1, wherein the output stage includes pull up transistors cross-coupled between nodes and a transistor connected to one of the nodes that accelerates the fall of one of the nodes and after a low to high transition of an input signal, holds the node to a low voltage unless the input signal goes below a reverse trip point which is lower than a forward trip point.

6. The system of claim 1, wherein the output stage includes a riding transistor involving no static power consumption.

7. A domino circuit, comprising:
   a precharge circuit including a source follower nFET device and a p-boosting pFET device coupled to a domino stage conductor;
   an evaluation path circuit coupled to the domino stage conductor; and
   an output stage to receive a signal from the domino stage conductor and to provide therefrom an evaluated output signal.

8. The circuit of claim 1, wherein the output stage is a hysteretic output stage.

9. The circuit of claim 1, further comprising body bias voltage circuitry to provide a bias voltage to a body of the source follower device.

10. The circuit of claim 1, wherein the output stage provides a signal which is a complement of the evaluated output signal.

11. A domino circuit, comprising:
   a precharge circuit coupled to a domino stage conductor;
   an evaluation path circuit coupled to the domino stage conductor; and
   an output stage including an inverter to receive a signal from the domino stage conductor and to provide an evaluated output signal on an output conductor, the output stage including a duplicate evaluation path circuit coupled to the output conductor.

12. The circuit of claim 11, wherein the duplicate evaluation path circuit pulls the evaluated output signal up when the inverter pulls up, and the duplicate evaluation path circuit is OFF when the inverter pulls down.

13. The circuit of claim 11, wherein the precharge circuit includes a pFET pull-up device.

14. The circuit of claim 11, wherein the precharge circuit includes an nFET pull-up device.

15. The circuit of claim 11, wherein the precharge circuit includes an nFET pull-up device and a p-boosted pFET pull-up device.

16. The circuit of claim 11, wherein the evaluation path circuit includes nFET devices and the duplicate evaluation path circuit includes pFET devices.

* * * * *